(12) United States Patent
Doi et al.

(10) Patent No.: US 10,112,872 B2
(45) Date of Patent: Oct. 30, 2018

(54) COMPOSITION FOR FORMING MN AND NB CO-DOPED PZT-BASED PIEZOELECTRIC FILM

(71) Applicant: MITSUBISHI MATERIALS CORPORATION, Tokyo (JP)

(72) Inventors: Toshihiro Doi, Naka-gun (JP); Hideaki Sakurai, Naka-gun (JP); Nobuyuki Soyama, Matsudo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/127,531

(22) PCT Filed: Mar. 12, 2015

(86) PCT No.: PCT/JP2015/057297
§ 371 (c)(1),
(2) Date: Sep. 20, 2016

(87) PCT Pub. No.: WO2015/146607
PCT Pub. Date: Oct. 1, 2015

(65) Prior Publication Data
US 2017/0129815 A1    May 11, 2017

(30) Foreign Application Priority Data

Mar. 28, 2014 (JP) ................. 2014-067835

(51) Int. Cl.
*C04B 35/491* (2006.01)
*C04B 35/622* (2006.01)
(Continued)

(52) U.S. Cl.
CPC .......... *C04B 35/491* (2013.01); *C04B 35/624* (2013.01); *C04B 35/6264* (2013.01);
(Continued)

(58) Field of Classification Search
None
See application file for complete search history.

(56) References Cited

U.S. PATENT DOCUMENTS 6,066,581 A * 5/2000 Chivukula ............ C04B 35/491
106/287.19
6,086,665 A * 7/2000 Kamisawa .......... C23C 18/1216
106/287.18
(Continued)

FOREIGN PATENT DOCUMENTS

CN        1983464 A     6/2007
CN      103359785 A    10/2013
(Continued)

OTHER PUBLICATIONS

A. L. Kholkin et al., "Self-polarization effect in Pb(Zr,Ti)O3 thin films", Integrated Ferroelectrics, vol. 22, (1998, pp. 525-533.
(Continued)

*Primary Examiner* — Colin W. Slifka
(74) *Attorney, Agent, or Firm* — Locke Lord LLP

(57) ABSTRACT

A composition used for forming a PZT-based piezoelectric film formed of Mn and Nb co-doped composite metal oxides is provided, in which the composition includes PZT-based precursors so that a metal atom ratio (Pb:Mn:Nb:Zr:Ti) in the composition satisfies (1.00 to 1.25):(0.002 to 0.056):(0.002 to 0.056):(0.40 to 0.60):(0.40 to 0.60), a rate of Mn is from 0.20 to 0.80 when the total of metal atom rates of Mn and Nb is 1, a rate of Zr is from 0.40 to 0.60 when the total of metal atom rates of Zr and Ti is 1, and the total rate of Zr and Ti is from 0.9300 to 0.9902 when the total of metal atom rates of Mn, Nb, Zr, and Ti is 1.

2 Claims, 2 Drawing Sheets

(51) Int. Cl.

| | | |
|---|---|---|
| *C04B 35/624* | (2006.01) | |
| *C04B 35/626* | (2006.01) | |
| *C04B 35/632* | (2006.01) | |
| *C04B 35/634* | (2006.01) | |
| *C04B 35/64* | (2006.01) | |
| *H01L 41/187* | (2006.01) | |
| *H01L 41/318* | (2013.01) | |

(52) U.S. Cl.
CPC ...... *C04B 35/62218* (2013.01); *C04B 35/632* (2013.01); *C04B 35/63444* (2013.01); *C04B 35/64* (2013.01); *H01L 41/1876* (2013.01); *H01L 41/318* (2013.01); *C04B 2235/3234* (2013.01); *C04B 2235/3249* (2013.01); *C04B 2235/3255* (2013.01); *C04B 2235/3268* (2013.01); *C04B 2235/3296* (2013.01); *C04B 2235/606* (2013.01); *C04B 2235/6567* (2013.01); *C04B 2235/96* (2013.01)

(56) References Cited

U.S. PATENT DOCUMENTS

| | | |
|---|---|---|
| 2009/0246360 A1 | 10/2009 | Hamada et al. |
| 2013/0256580 A1 | 10/2013 | Doi et al. |

FOREIGN PATENT DOCUMENTS

| | | |
|---|---|---|
| JP | 09-223830 A | 8/1997 |
| JP | 10-081016 A | 3/1998 |
| JP | 2001-261338 A | 9/2001 |
| JP | 2003-221229 A | 8/2003 |
| JP | 2009-290364 A | 12/2009 |
| JP | 2009-290369 A | 12/2009 |
| JP | 2013-211309 A | 10/2013 |

OTHER PUBLICATIONS

Jian Zhong et al., "Effect of Nb Doping on Highly[100]-Textured PZT Films Grown on CSD-Prepared PbTiO3 Seed Layers", Integrated Ferroelectrics, 130, 2011, pp. 1-11.

K .Wasa et al., "Microstructure and Piezoelectric Properties of PZT-based Ternary Perovskite Pb(Mn,Nb)O3-PZT Thin Films", Applications of Ferroelectrics, 2009, ISAF 2009. 18th IEEE International Symposium on the, Aug. 27, 2009, pp. 1-5 (cited in the ISR).

International Search Report dated May 19, 2015, issued for PCT/JP2015/057297 and English translation thereof.

Office Action dated Mar. 7, 2017, issued for the Japanese patent application No. 2016-510226 and English translation thereof.

Office Action dated Jul. 25, 2017, issued for the Japanese patent application No. 2016-510226 and English translation thereof.

Kiyotaka Wasa et al., "PZT-based high coupling with low permittivity thin films", 2013 Joint IEEE International Symposium on Applications of Ferroelectric and Workshop on Piezoresponse Force Microscopy (ISAF/PFM), IEEE, Jul. 21, 2013, pp. 69-72. (cited in the Oct. 27, 2017 EP Search Report).

P. Victor et al., "Effect of Manganese Doping on the Electrical Characteristics of SOL-GEL Derived Lead Zirconate Titanate Thin Films", Integrated Ferroelectrics, vol. 82, No. 1, Nov. 1, 2006, pp. 65-80 and a cover page. (cited in the Oct. 27, 2017 EP Search Report).

Supplementary European Search Report dated Oct. 27, 2017, issued for the European patent application No. 15770305.9.

Office Action dated Mar. 28, 2018, issued for the Chinese patent application No. 201580006889.7 and English translation thereof.

Office Action dated Apr. 16, 2018, issued for the Taiwanese patent application No. 104107912 and English translation thereof.

\* cited by examiner

COMPOSITION FOR FORMING MN AND NB CO-DOPED PZT-BASED PIEZOELECTRIC FILM

TECHNICAL FIELD

The present invention relates to a composition for forming a Mn and Nb co-doped PZT-based piezoelectric film used in a piezoelectric element, an integrated passive device (IPD), a pyroelectric element, or the like.

Priority is claimed on Japanese Patent Application No. 2014-067835, filed Mar. 28, 2014, the content of which is incorporated herein by reference.

BACKGROUND ART

A ferroelectric film of PZT or the like formed by using a chemical solution deposition (CSD) method represented by a sol-gel method cannot be used as a piezoelectric body immediately after being formed, and a poling process is necessarily performed in order to use the ferroelectric film in a gyro sensor or the like. In a case of using this ferroelectric film in a sensor such as a pyroelectric sensor or a gyro sensor, a performance index g of a piezoelectric film (ferroelectric film) used is represented by the following Formula (1).

$$g(V \cdot m/N) = d_{31}/\varepsilon_{33} \quad (1)$$

In Formula (1), $d_{31}$ represents a piezoelectric constant and $\varepsilon_{33}$ represents a dielectric constant.

That is, in a case of using a ferroelectric film of PZT or the like in a sensor such as a pyroelectric sensor or a gyro sensor, it is generally desirable that a piezoelectric constant of a film be great and a dielectric constant or a dielectric loss (tan δ) of a film be low. In addition, it is desirable that polarization directions of a film be aligned immediately after a film is formed, from the viewpoints of stability of polarization and needlessness of a polarization step.

In a case of using such a film in an actuator of an ink jet head or the like, the film is used by applying a high voltage, and accordingly, a poling process is not always necessary. This is because, in a case of using such a film by applying a high voltage, polarization is performed with a driving voltage, even when polarization directions of the film are not aligned immediately after the film is formed, for example. Even if a poling process is performed, depolarization may occur at the time of a thermal treatment such as a reflow process after the poling process.

Regarding such problems, self-poling has been investigated and a phenomenon in which polarization directions are aligned to one direction immediately after a film is formed has been reported. A specific mechanism regarding this self-poling phenomenon is not clear, but it has been reported that charge trapped in internal electric fields or electrode interfaces in a film is one of the reasons (for example, see NPL 1).

Regarding a piezoelectric constant, it is known that, when Nb is added at the time of forming a PZT thin film represented by $PbZr_xTi_{1-x}O_3$ by using a sol-gel method, piezoelectric properties are improved (for example, see NPL 2). NPL 2 discloses a research result regarding a {100}-oriented PZT thin film grown by doping Nb on a seed layer of $PbTiO_3$ formed by using a CSD method. Specifically, NPL 2 discloses a research result when a {100}-oriented $Pb_{1.1}Zr_{0.52}Ti_{0.48}O_3$ thin film having a thickness of 1 μm is doped with Nb within a range of 0 atom % to 4 atom %. NPL 2, for example, discloses that a high degree of {100} orientation of 97% is obtained in the entire film or maximum polarization, residual polarization, squareness, and a saturated holding force of the entire PZT thin film are decreased together with a doping level of Nb, due to the incorporation of a thin seed layer of $Pb_{1.05}TiO_3$ having a thickness of several nm. In addition, NPL 2 discloses that a PZT thin film doped with 3% of Nb shows the highest piezoelectric constant $-e_{31,f}$ of 12.9 C/cm$^2$, which is higher than other thin films having other doping levels by 5% to 15%.

CITATION LIST

Non-Patent Literature

[NPL 1] A. L. Kholkin et al. "Self-polarization effect in Pb(Zr,Ti)O$_3$ thin films", Integrated Ferroelectrics, 22 (1998) 525-533.

[NPL 2] Jian Zhong et al. "Effect of Nb Doping on Highly [100]-Textured PZT Films Grown on CSD-Prepared PbTiO$_3$ Seed Layers", Integrated Ferroelectrics, 130 (2011) 1-11.

SUMMARY OF INVENTION

Technical Problem

However, in a film forming method disclosed in NPL 1, although a self-poling phenomenon has been observed, a spontaneous polarization value is small and is not practically sufficient.

In a technology for improving piezoelectric properties of a PZT thin film by adding Nb disclosed in NPL 2, a piezoelectric constant is improved, when a Nb-doped PZT thin film (PNbZT thin film) is formed by using a wet method, that is, a CSD method using a sol-gel solution. On the other hand, a film having aligned polarization directions immediately after a film is formed, cannot be obtained, and in a case of using the film as a sensor, stability of a polarization state may be poor. When the storage stability of a sol-gel solution is poor, it is not possible to form a film having excellent piezoelectric properties by using liquid to be stored for a long period of time or liquid having a poor state of preservation. Thus, it is also necessary to provide high storage stability of a sol-gel solution used.

According to the present invention, a first object is to provide a composition for forming a Mn and Nb co-doped PZT-based piezoelectric film having excellent storage stability, in which the composition can improve a piezoelectric constant of a piezoelectric film, decrease a dielectric constant, and form a piezoelectric film having excellent stability after a poling process.

Solution to Problem

According to a first aspect of the present invention, a composition for forming a Mn and Nb co-doped PZT-based piezoelectric film used for forming a PZT-based piezoelectric film formed of Mn and Nb co-doped composite metal oxides is provided, the composition including: PZT-based precursors containing metal atoms configuring the composite metal oxides, in which the PZT-based precursors are contained in the composition so that a metal atom ratio (Pb:Mn:Nb:Zr:Ti) in the composition satisfies (1.00 to 1.25):(0.002 to 0.056):(0.002 to 0.056):(0.40 to 0.60):(0.40 to 0.60), a rate of Mn is from 0.20 to 0.80 when the total of metal atom rates of Mn and Nb is 1, a rate of Zr is from 0.40 to 0.60 when the total of metal atom rates of Zr and Ti is 1, and the total rate of Zr and Ti is from 0.9300 to 0.9902 when the total of metal atom rates of Mn, Nb, Zr, and Ti is 1.

According to a second aspect of the present invention, in the first aspect, the composition further includes: acetylacetone as a stabilizer; and a diol as a solvent.

According to a third aspect of the present invention, in the second aspect, the diol is propylene glycol or ethylene glycol.

According to a fourth aspect of the present invention, in the second or third aspect, an amount of acetylacetone contained in the composition is from 0.5 moles to 4 moles when the total amount of Mn, Nb, Zr, and Ti contained in the composition is 1 mole.

According to a fifth aspect of the present invention, in the second or fourth aspect, a rate of the diol in 100 mass % of the composition is from 16 mass % to 56 mass %.

According to a sixth aspect of the present invention, in the first to fifth aspects, the composition further includes: polyvinylpyrrolidone at a rate so as to obtain 0.01 moles to 0.25 moles of polyvinylpyrrolidone with respect to 1 mole of the PZT-based precursor, in terms of monomers.

Advantageous Effects of Invention

The composition according to the first aspect of the present invention is used for forming a PZT-based piezoelectric film formed of Mn and Nb co-doped composite metal oxides. The composition includes the PZT-based precursors containing metal atoms configuring the composite metal oxides, and the PZT-based precursors are contained in the composition so that a metal atom ratio (Pb:Mn:Nb:Zr:Ti) in the composition satisfies (1.00 to 1.25):(0.002 to 0.056):(0.002 to 0.056):(0.40 to 0.60):(0.40 to 0.60), a rate of Mn is from 0.20 to 0.80 when the total of metal atom rates of Mn and Nb is 1, a rate of Zr is from 0.40 to 0.60 when the total of metal atom rates of Zr and Ti is 1, and the total rate of Zr and Ti is from 0.9300 to 0.9902 when the total of metal atom rates of Mn, Nb, Zr, and Ti is 1. Accordingly, it is possible to form a piezoelectric film having a high piezoelectric constant, showing greater displacement than that in a predetermined electric field, and having a low dielectric constant. Since a Mn and Nb co-doped PZT-based piezoelectric film in which the orientation is controlled to the (100) plane has polarization directions aligned upwardly (in the film thickness direction) immediately after being formed, it is possible to improve the stability of polarization by forming a piezoelectric film in which the orientation is controlled to the (100) plane using the composition. Thus, when this composition is used, it is possible to form a piezoelectric film which can be operated as a device by applying an electric field to a negative side, even when polarization is not performed. In addition, it is possible to form a piezoelectric film in which depolarization due to a thermal treatment such as a reflow process hardly occurs after the poling process.

Since the composition according to the second aspect of the present invention includes acetylacetone as a stabilizer, it is possible to obtain high storage stability and prevent generation of precipitates or the like due to storage for a long period of time. In addition, since the composition includes a diol as a solvent component together with acetylacetone, the storage stability of the composition is further improved.

In the composition according to the third aspect of the present invention, since the diol is propylene glycol or ethylene glycol, it is possible to prevent generation of voids at the time of forming a film and to form a dense piezoelectric film.

Since the composition according to the fourth aspect of the present invention includes acetylacetone as a stabilizer at a predetermined rate, the storage stability is extremely high.

Since the composition according to the fifth aspect of the present invention includes diol as a solvent at a predetermined rate, an effect of preventing generation of voids at the time of forming a film is extremely high.

Since the composition according to the sixth aspect of the present invention further includes polyvinylpyrrolidone at a predetermined rate, it is possible to prevent generation of cracks and the like even when forming a thick film having a film thickness equal to or greater than 150 nm per 1 layer and to increase production efficiency.

DESCRIPTION OF EMBODIMENTS

Figure 1:
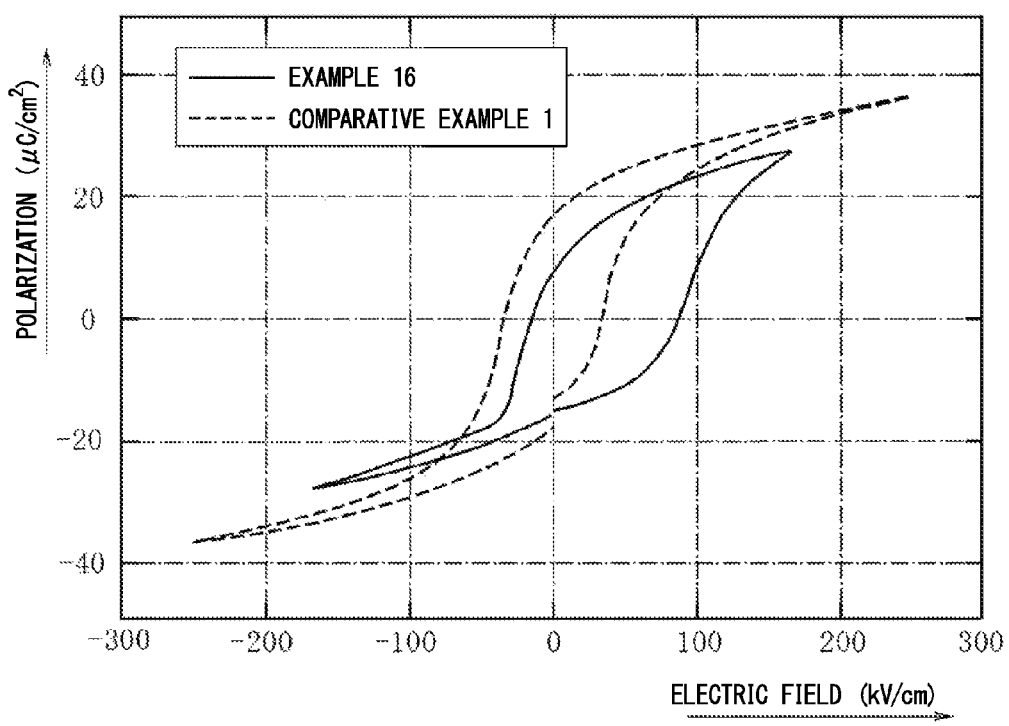
FIG. 1 is a diagram showing hysteresis curves of piezoelectric films of Example 16 and Comparative Example 1.

Next, an embodiment of the present invention will be described with reference to the drawings. A composition of the embodiment is used for forming a Mn and Nb co-doped PZT-based piezoelectric film. This Mn and Nb co-doped PZT-based piezoelectric film is a piezoelectric film having a desired composition in which Mn and Nb elements are added to Pb-containing composite metal oxides having a perovskite structure such as lead zirconate titanate (PZT). In addition, PZT-based precursors containing metal atoms configuring the composite metal oxides are contained in this composition.

A PZT-based precursor contained in the composition is a raw material for configuring the composite metal oxides and the like in the formed piezoelectric film and is contained at a rate so that each metal atom configuring the composite metal oxides satisfies a desired metal atom ratio. Specifically, the metal atom ratio (Pb:Mn:Nb:Zr:Ti) in the composition satisfies (1.00 to 1.25):(0.002 to 0.056):(0.002 to 0.056):(0.40 to 0.60):(0.40 to 0.60), a rate of Mn is from 0.20 to 0.80 when the total of metal atom rates of Mn and Nb is 1, a rate of Zr is from 0.40 to 0.60 when the total of metal atom rates of Zr and Ti is 1, and the total rate of Zr and Ti is from 0.9300 to 0.9902 when the total of metal atom rates of Mn, Nb, Zr, and Ti is 1. Accordingly, the formed piezoelectric film is controlled so as to have a desired composition in which the metal atom ratio (Pb:Mn:Nb:Zr:Ti) preferably satisfies (0.98 to 1.12):(0.002 to 0.056):(0.002 to 0.056):(0.40 to 0.60):(0.40 to 0.60), a rate of Mn is from 0.20 to 0.80 when the total of metal atom rates of Mn and Nb is 1, a rate of Zr is from 0.40 to 0.60 when the total of metal atom rates of Zr and Ti is 1, and the total rate of Zr and Ti is from 0.9300 to 0.9902 when the total of metal atom rates of Mn, Nb, Zr, and Ti is 1. In this specification, a degree (high or low) of a piezoelectric constant means a degree (high and low) of an absolute value of a piezoelectric constant.

In a case of a PZT film which is not doped with Mn and Nb and is formed by a wet coating method such as a sol-gel method, piezoelectric properties are not exhibited, immediately after a film is formed. On the other hand, in a film which is doped with Mn and Nb and is oriented to the (100)

plane at a high rate, a film in which the hysteresis is shifted to a positive side and polarization directions of the entire film are aligned upwardly (in the film thickness direction) immediately after being formed is obtained. Since such a film has excellent stability of polarization due to an imprint phenomenon of the hysteresis and low dielectric constant and dielectric loss (tan δ), the film is more easily formed as a film suitable for a piezoelectric body.

As a PZT-based precursor, a compound in which organic groups are bonded with each metal atom such as Pb, Mn, Nb, Zr, and Ti through oxygen or nitrogen atoms thereof is preferably used as each metal source (Pb source, Mn source, Nb source, Zr source, and Ti source). For example, one or more kinds selected from the group consisting of metal alkoxides, a metal diol complex, a metal triol complex, metal carboxylate, a metal β-diketonate complex, a metal β-diketoester complex, a metal β-iminoketo complex, and a metal amino complex are used. The particularly preferable compound is metal alkoxides, partial hydrolyzate thereof, or organic acid salt.

Specifically, examples of the Pb compound include acetate such as lead acetate: $Pb(OAc)_2$, or alkoxides such as lead diisopropoxide: $Pb(OiPr)_2$. Examples of the Mn compound include organic acid salt such as manganese 2-ethylhexanoate, manganese naphthenate, or manganese acetate, or a metal β-diketonate complex such as acetylacetone manganese. Among these Mn compounds, manganese naphthenate and manganese acetate are more preferably used. Examples of the Nb compound include alkoxides such as niobium pentaethoxide or organic acid salt such as niobium 2-ethylhexanoate. Examples of the Ti compound include alkoxides such as titanium tetraethoxide: $Ti(OEt)_4$, titanium tetraisopropoxide: $Ti(OiPr)_4$, titanium tetra-n-butoxide: $Ti(OnBu)_4$, titanium tetraisobutoxide: $Ti(OiBu)_4$, titanium tetra t-butoxide: $Ti(OtBu)_4$, and titanium dimethoxy diisopropoxide: $Ti(OMe)_2(OiPr)_2$. Among these Ti compounds, titanium tetraisopropoxide and titanium tetra-n-butoxide are more preferably used. In addition, examples of the Zr compound preferably include the same alkoxides as the Ti compound, that is, zirconium tetraethoxide: $Zr(OEt)_4$, zirconium tetraisopropoxide: $Zr(OiPr)_4$, zirconium tetra-n-butoxide: $Zr(OnBu)_4$, zirconium tetraisobutoxide: $Zr(OiBu)_4$, zirconium tetra t-butoxide: $Zr(OtBu)_4$, and zirconium-dimethoxy diisopropoxide: $Zr(OMe)_2(OiPr)_2$. Among these Zr compounds, zirconium tetra-n-butoxide and zirconium tetraisopropoxide are more preferably used. The metal alkoxide may be used as it is, but partial hydrolyzate thereof may be used in order to promote decomposition.

These PZT-based precursors, that is, the Pb compound, the Nb compound, the Mn compound, the Ti compound, and the Zr compound are contained in the composition at a rate so as to have the desired metal atom ratio described above. Here, the rate (atom ratio) of Mn in the composition is controlled so as to fall in the range described above, because the rate of Mn is extremely decreased in the formed piezoelectric film and a film having aligned polarization directions is not obtained when the rate of Mn in the composition with respect to each metal element is smaller than the lower limit value of the range described above. On the other hand, when the rate of Mn in the composition with respect to each metal element is greater than the upper limit value of the range described above, the rate of Mn is extremely increased in the formed piezoelectric film and electric properties are deteriorated. An atom rate of Mn of the metal atom ratio (Pb:Mn:Nb:Zr:Ti) in the composition is preferably from 0.005 to 0.020 and more preferably from 0.010 to 0.016, but there is no limitation. When the total of the metal atom rates of Mn and Nb is 1, the rate of Mn is preferably from 0.33 to 0.67 and more preferably from 0.40 to 0.60, but there is no limitation.

The rate of Nb in the composition is controlled so as to fall in the range described above, because the rate of Nb is extremely decreased in the formed piezoelectric film and electrical properties cannot be sufficiently improved when the rate of Nb in the composition with respect to each metal element is smaller than the lower limit value of the range described above. On the other hand, when the rate of Nb in the composition with respect to each metal element is greater than the upper limit value of the range described above, the rate of Nb is extremely increased in the formed piezoelectric film and cracks are generated. An atom rate of Nb of the metal atom ratio (Pb:Mn:Nb:Zr:Ti) in the composition is preferably from 0.005 to 0.020 and more preferably from 0.010 to 0.016, but there is no limitation.

The rates of Zr and Ti in the composition are controlled so as to fall in the range described above, because the rates of Zr and Ti in the formed piezoelectric film are beyond a desired range and a piezoelectric constant of the piezoelectric film cannot be sufficiently improved when the rates of Zr and Ti in the composition are beyond the range described above. An atom rate of Zr of the metal atom ratio (Pb:Mn:Nb:Zr:Ti) in the composition is preferably from 0.45 to 0.55 and more preferably from 0.48 to 0.52, but there is no limitation. An atom rate of Ti is preferably from 0.45 to 0.55 and more preferably from 0.48 to 0.52, but there is no limitation. When the total of the metal atom rates of Zr and Ti is 1, the rate of Zr is preferably from 0.45 to 0.55 and more preferably from 0.48 to 0.52, but there is no limitation. When the total of the metal atom rates of Mn, Nb, Zr, and Ti is 1, the total rate of Zr and Ti is preferably from 0.96 to 0.99 and more preferably from 0.97 to 0.98, but there is no limitation.

The rate of Pb in the composition is controlled so as to fall in the range described above, because the rate of Pb is extremely decreased in the formed piezoelectric film, a large amount of pyrochlore phases is contained in the film, and electrical properties such as piezoelectric properties are significantly deteriorated when the rate of Pb in the composition is smaller than the lower limit value of the range described above. On the other hand, when the rate of Pb in the composition is greater than the upper limit value of the range described above, the rate of Pb is extremely increased in the formed piezoelectric film, a large amount of PbO remains in the sintered film, and electrical reliability of the film is deteriorated due to an increase in leakage current. That is, an excessive amount of lead easily remains in the film and leakage properties or insulating properties are deteriorated. The atom rate of Pb of the metal atom ratio (Pb:Mn:Nb:Zr:Ti) in the composition is preferably from 1.10 to 1.20 and more preferably from 1.12 to 1.15, but there is no limitation.

A concentration of the PZT-based precursor occupying 100 mass % of the composition is preferably from 10 mass % to 35 mass %, in terms of an oxide concentration. The concentration of the PZT-based precursor is preferably limited to be in the range described above, because a sufficient film thickness is hardly obtained when the concentration thereof is less than the lower limit value, and cracks are easily generated when the concentration thereof exceeds the upper limit value. Among these, the concentration of the PZT-based precursor occupying 100 mass % of the composition is preferably from 17 mass % to 25 mass % and more preferably from 20 mass % to 25 mass %, in terms of an oxide concentration, but there is no limitation. The oxide concentration of the concentration of the PZT-based precursor occupying the composition is a concentration of metal oxides occupying 100 mass % of the composition which is calculated by assuming that all of the metal atoms contained in the composition are desired oxides (in the composition, all metal atoms satisfy $Pb_x(Mn_yNb_zZr_tTi_s)O_{(x+3y+5z/2+t/2+s/2)}$).

It is preferable that diols be contained in the composition. A diol is a component which is a solvent of the composition. Specific examples of diols include propylene glycol, ethylene glycol, and 1,3-propanediol. Among these, propylene glycol or ethylene glycol is particularly preferable. When the diol is set as an essential solvent component, it is possible to increase the storage stability of the composition.

A rate of the diols in 100 mass % of the composition is preferably from 16 mass % to 56 mass %. The rate of the diols is preferably limited to be in the range described above, because precipitates may be generated when the rate thereof is less than the lower limit value, and on the other hand, voids (micropores) are easily generated, at the time of obtaining a thick film when the rate thereof exceeds the upper limit value. Among these, the rate of the diols is preferably from 28 mass % to 42 mass % and more preferably from 30 mass % to 40 mass %, but there is no limitation.

Examples of other solvents include carboxylic acid, alcohol (for example, ethanol or 1-butanol, or polyalcohol other than diol), ester, ketones (for example, acetone or methyl ethyl ketone), ethers (for example, dimethyl ether or diethyl ether), cycloalkanes (for example, cyclohexane or cyclohexanol), aromatics (for example, benzene, toluene, or xylene), and other tetrahydrofurans, and a mixed solvent obtained by mixing one or more kinds of these to a diol can also be used.

Specifically, as carboxylic acid, n-butyric acid, α-methyl butyrate, i-valeric acid, 2-ethylbutyrate, 2,2-dimethylbutyrate, 3,3-dimethylbutyrate, 2,3-dimethylbutyrate, 3-methylpentanoate, 4-methylpentanoate, 2-ethylpentanoate, 3-ethylpentanoate, 2,2-dimethylpentanoate, 3,3-dimethylpentanoate, 2,3-dimethylpentanoate, 2-ethylhexanoate, or 3-ethylhexanoate are preferably used.

As ester, ethyl acetate, propyl acetate, n-butyl acetate, sec-butyl acetate, tert-butyl acetate, isobutyl acetate, n-amyl acetate, sec-amyl acetate, tert-amyl acetate, or isoamyl acetate is preferably used, and as alcohol, 1-propanol, 2-propanol, 1-butanol, 2-butanol, iso-butyl alcohol, 1-pentanol, 2-pentanol, 2-methyl-2-pentanol, or 2-methoxyethanol is preferably used.

In addition, polyvinylpyrrolidone (PVP), which is a polymer compound, is preferably contained in the composition. Polyvinylpyrrolidone is preferable for adjusting liquid viscosity in the composition and has a great effect of preventing cracks. Particularly, polyvinylpyrrolidone is used for adjusting relative viscosity determined by using a k value. The k value herein is a viscosity property value correlating with a molecular mass, and is a value calculated by applying a relative viscosity value (25° C.) measured by using a capillary viscometer in the following Fikentscher's equation.

$$k \text{ value}=(1.5 \log \eta rel-1)/(0.15+0.003c)+(300c \log \eta rel+(c+1.5c \log \eta rel)^2)^{1/2}/(0.15c+0.003c^2)$$

In the equation, "ηrel" represents a relative viscosity of polyvinylpyrrolidone aqueous solution with respect to water and "c" represents a polyvinylpyrrolidone concentration (mass %) in the polyvinylpyrrolidone aqueous solution. The k value of polyvinylpyrrolidone is preferably from 30 to 90. In order to form a thick piezoelectric film, it is necessary to have sufficient viscosity in order that a coated film (gel film) maintains a thickness thereof at the time of coating a substrate or the like with the composition. However, when the k value is less than the lower limit value, sufficient viscosity is hardly obtained. On the other hand, when the k value exceeds the upper limit value, viscosity becomes excessively high and it is difficult to uniformly apply the composition.

A rate of polyvinylpyrrolidone is preferably a rate so as to obtain 0.005 moles to 0.25 moles of polyvinylpyrrolidone with respect to 1 mole of the PZT-based precursor, in terms of monomers. The rate of polyvinylpyrrolidone is preferably limited to the range described above, because cracks are easily generated when the rate thereof is less than the lower limit value, and voids are easily generated when the rate thereof exceeds the upper limit value. Among these, the rate of polyvinylpyrrolidone is particularly preferably set as a rate so as to obtain 0.025 moles to 0.075 moles and more preferably from 0.025 to 0.030 with respect to 1 mole of the PZT-based precursor, in terms of monomers, but there is no limitation.

Here, 1 mole of the PZT-based precursor is the amount of the precursor material contained in 1 mole of a compound represented by a compositional formula $Pb_x(Mn_yNb_zZr_tTi_s)O_{(x+3y+5z/2+t/2+s/2)}$.

A mole value in terms of monomers means a mole value using a molecular mass of monomers configuring a polymer as a reference, and a mole value with respect to 1 mole of the PZT-based precursor in terms of monomers means a mole value with respect to 1 mole of the PZT-based precursor using a molecular mass of monomers configuring a polymer (in this case, polyvinylpyrrolidone) as a reference.

It is preferable that linear monoalcohol having 6 to 12 carbon atoms be added into the composition of the present embodiment, and a rate thereof added be preferably from 0.6 mass % to 10 mass % in 100 mass % of the composition. When an appropriate amount of linear monoalcohol is contained in the composition, a gel film which can effectively release organic materials to the outside of the film can be formed at the time of calcination. As a result, a dense and high-performance Mn and Nb co-doped PZT-based piezoelectric film can be obtained, even when the film thickness exceeds 100 nm. The number of carbon atoms of the linear monoalcohol is preferably from 6 to 12, because a boiling point is not sufficiently high and the film may not be sufficiently densified when the number of carbon atoms is less than the lower limit value. On the other hand, when the number of carbon atoms exceeds the upper limit value, the film can be densified, but solubility to a sol-gel solution is low, it is difficult to dissolve a sufficient amount of the linear monoalcohol, and viscosity of the solution excessively increases. Thus, uniform coating may not be performed due to generation of striation (stria or stripe) or the like. The number of carbon atoms of the linear monoalcohol is more preferably from 7 to 9. The rate of the linear monoalcohol in 100 mass % of the composition is preferably in the range described above, because, when the rate thereof is lower than the lower limit value, a sufficient clearance is not obtained in the film and organic materials in the film cannot be effectively removed during the process. Thus, the film may not be sufficiently densified. On the other hand, when the rate thereof exceeds the upper limit value, the drying of the film is delayed and a certain period of time is taken until the drying is completed. Thus, the film thickness may become thin. The rate of the linear monoalcohol in 100 mass % of the composition is more preferably from 1 mass % to 3 mass %. In addition, linear monoalcohol having 6 carbon atoms is 1-hexanol, linear monoalcohol having 7 carbon atoms is 1-heptanol, linear monoalcohol having 8 carbon atoms is 1-octanol, and linear monoalcohol having 9 carbon atoms is 1-nonanol. Further, linear monoalcohol having 10 carbon atoms is 1-decanol, linear monoalcohol having 11 carbon atoms is 1-undecanol, and linear monoalcohol having 12 carbon atoms is 1-dodecanol.

In addition to the components described above, as a stabilizer, if necessary, β-diketones (for example, acetylacetone, heptafluoro butanoylpivaloyl methane, dipivaloylmethane, trifluoroacetylacetone, benzoyl acetone, or the like), β-ketone acids (for example, acetoacetic acid, propionyl acetate, benzoyl acetate, or the like), β-ketoesters (for example, lower alkyl esters such as methyl, propyl, or butyl of the ketone acids described above), oxy acids (for example, lactic acid, glycolic acid, α-oxy butyrate, salicylic acid, or the like), lower alkyl esters of the oxyacids described above, oxyketones (for example, diacetone alcohol, acetoin, or the like), diol, triol, higher carboxylic acid, alkanolamines (for example, diethanolamine, triethanolamine, monoethanolamine, or the like), polyamine, or the like may be added in an amount of approximately 0.2 to 3 in terms of a value of (molecular number of stabilizer)/(metal atom number). Among these, acetylacetone of β-diketones is preferable as the stabilizer. A rate of the stabilizer such as acetylacetone is preferably a rate so that the content thereof contained in the composition becomes 0.5 moles to 4 moles when the total amount of Mn, Nb, Zr, and Ti contained in the composition is 1 mole, because it is suitable for improving the storage stability. The rate of acetylacetone is more preferably a rate so that the content thereof becomes 1 mole to 3 moles and particularly preferably a rate so that the content thereof becomes 1.5 moles to 2 moles, but there is no limitation.

A manufacturing method of the composition for forming a Mn and Nb co-doped PZT-based piezoelectric film of the present embodiment will be described. First, the PZT-based precursors such as the Pb compound described above are prepared and these are weighed to have a rate so as to have the desired metal atom ratio described above. The weighed PZT-based precursors described above and a diol are put into a reaction vessel and mixed with each other, and refluxed and reacted with each other preferably in a nitrogen atmosphere at a temperature of 130° C. to 175° C. for 0.5 hours to 3 hours, and thus, synthetic liquid is prepared. After refluxing, it is preferable to perform desolventizing by using a method of atmospheric distillation or reduced pressure distillation. In a case of adding the stabilizer such as acetylacetone, when putting the PZT-based precursor and the diol into a reaction vessel, the stabilizer is also added and mixed with them. Alternatively, it is preferable to add the stabilizer to the synthetic liquid after the desolventizing, and perform refluxing in the nitrogen atmosphere, at a temperature of 130° C. to 175° C. for 0.5 hours to 5 hours. After that, the synthetic liquid is cooled to room temperature (approximately 25° C.) by performing natural cooling at room temperature. After the cooling, a concentration of the PZT-based precursor contained in the synthetic liquid is adjusted to a desired concentration by adding solvents other than diol. By performing the steps described above, the composition of the present embodiment can be obtained. It is preferable that the amounts of the PZT-based precursor and diol used be adjusted so that the concentration of the PZT-based precursor in 100 mass % of the composition finally obtained becomes 10 mass % to 35 mass % in terms of an oxide concentration and the concentration of diol becomes 16 mass % to 56 mass %.

In a case of adding the linear monoalcohol or polyvinylpyrrolidone described above, the following step is further performed. In a case of adding the linear monoalcohol, when adding solvents other than the diol to the cooled synthetic liquid, the linear monoalcohol is also added thereto to prepare a sol-gel solution. Then, this sol-gel solution is refluxed again in a predetermined atmosphere, for example, a nitrogen atmosphere, at a temperature of 100° C. to 175° C. for 0.5 hours to 10 hours.

An amount of polyvinylpyrrolidone so as to have a rate with respect to 1 mole of the PZT-based precursor of 0.005 moles to 0.25 moles in terms of monomers is added to the sol-gel solution or the cooled synthetic liquid, the concentration of which is adjusted by adding solvents other than diol and which do not contain the linear monoalcohol, and the polyvinylpyrrolidone is evenly dispersed by stirring. Accordingly, the composition for forming the Mn and Nb co-doped PZT-based piezoelectric film of the present embodiment can be obtained.

After preparing the composition, particles in this composition are removed by performing a filtering process or the like, and the number of particles having a particle size equal to or greater than 0.5 μm (particularly, equal to or greater than 0.3 μm, and more particularly, equal to or greater than 0.2 μm) is preferably equal to or less than 50 per 1 milliliter of the composition. When the number of particles in the composition having a particle size equal to or greater than 0.5 μm exceeds 50 per 1 milliliter of the composition, long-term storage stability is deteriorated. It is preferable that the number of particles in the composition having a particle size equal to or greater than 0.5 μm be as small as possible, and it is particularly preferable that the number thereof be equal to or smaller than 30 per 1 milliliter of the composition.

A state where the particles having a particle size equal to or greater than 0.2 μm in the composition are removed by the removal of particles caused by performing a filtering process or the like is preferable. A light-scattering type particle counter is used in the measurement of the number of particles in the composition.

A method of processing the composition for adjusting the number of particles to be in the range described above is not particularly limited, and the following methods are used, for example. A first method is a filtering method of transferring the composition under pressure with a syringe by using a commercially available membrane filter having a hole diameter of 0.2 μm. A second method is a pressure filtration method performed by combining a commercially available membrane filter having a hole diameter of 0.05 jam and a pressurized tank with each other. A third method is a cycle filtration method performed by combining the filter used in the second method and a liquid circulating bath with each other.

In any methods, particle capture rates obtained by using a filter are different depending on transfer pressure of the composition. It is generally known that the capture rate increases at lower pressure. Particularly, in the first method or the second method, it is preferable that the composition be caused to extremely slowly pass through the filter at low pressure, in order to realize the condition in which the number of particles having a particle size equal to or greater than 0.5 μm is equal to or smaller than 50 per 1 milliliter of the composition.

Next, a method of forming the Mn and Nb co-doped PZT-based piezoelectric film will be described. This forming method is a forming method of a piezoelectric film by using a sol-gel method and the composition for forming a Mn and Nb co-doped PZT-based piezoelectric film described above is used as a raw material solution.

First, the composition for forming a Mn and Nb co-doped PZT-based piezoelectric film described above is applied on a substrate (on a lower electrode on a substrate which will be described later) and a coated film (gel film) having a predetermined thickness is formed. The coating method is not particularly limited, and spin coating, dip coating, a liquid source misted chemical deposition (LSMCD) method, an electrostatic spray method, or the like is used. As the substrate where a piezoelectric film is formed, a silicon substrate where a lower electrode is formed or a heat-resistant substrate such as a sapphire substrate is used. A lower electrode formed on a substrate is formed by using a material having a conductive property and not reacting with a piezoelectric film, such as Pt, $TiO_x$, Ir, or Ru. For example, the lower electrode can have a double-layered structure of a $TiO_x$ film and a Pt film, in this order, from the substrate side. As a specific example of the $TiO_x$ film, a $TiO_2$ film is used. In a case of using a silicon substrate as a substrate, a $SiO_2$ film can be formed on a surface of this substrate.

It is desirable to form an orientation-controlled film in which the crystalline orientation is preferentially controlled to the (100) plane on the lower electrode where a piezoelectric film is to be formed before forming the piezoelectric film. This is because a film having aligned polarization directions immediately after being formed can be formed by strongly orienting the Mn and Nb co-doped PZT-based piezoelectric film to the (100) plane. Examples of the orientation-controlled film include a LNO film ($LaNiO_3$ film), a PZT film, a $SrTiO_3$ film, or the like in which the crystalline orientation is preferentially controlled to the (100) plane.

After forming a coating film on a substrate, this coating film is calcinated, sintered, and crystallized. The calcination is performed under predetermined conditions by using a hot plate, a rapid thermal annealing (RTA), or the like. The calcination is performed in order to remove a solvent and convert the metal compound into a composite oxide by pyrolysis or hydrolysis, and therefore, the calcination is desirably performed in the air, in the oxidation atmosphere, or in the atmosphere containing water vapor. Even when the heating is performed in the air, moisture necessary for hydrolysis is sufficiently ensured with moisture in the air. Before the calcinations, in order to remove particularly a low-boiling-point solvent or absorbed water molecules, low-temperature heating (drying) may be performed by using a hot plate or the like at a temperature of 70° C. to 90° C. for 0.5 minutes to 5 minutes.

The calcination is performed by holding the temperature preferably at 250° C. to 300° C. for 2 minutes to 5 minutes, but it is preferable to perform the calcination by performing two-stage calcination by changing a heating holding temperature in order to sufficiently remove a solvent or the like to further increase an effect of preventing generation of voids or cracks or in order to promote densifying of a film structure. In a case of performing the two-stage calcination, a first stage is calcination in which the temperature is held at 250° C. to 300° C. for 3 minutes to 10 minutes, and a second stage is calcination in which the temperature is held at 400° C. to 500° C. for 3 minutes to 10 minutes.

Here, the calcination temperature in the first stage is preferably in a range of 250° C. to 300° C., because pyrolysis of precursor material is insufficient and cracks are easily generated when the calcination temperature is lower than the lower limit value. On the other hand, when the calcination temperature exceeds the upper limit value, the precursor material on the upper portion of the substrate is decomposed before the precursor material in the vicinity of the substrate is completely decomposed, the organic materials remain around the substrate of the film, and the voids are easily generated. The calcination time in the first stage is preferably from 3 minutes to 10 minutes, because the decomposition of the precursor material does not sufficiently proceed when the calcination time is shorter than the lower limit value, and the process time is increased and productivity may be decreased when the calcination time exceeds the upper limit value. The calcination temperature in the second stage is preferably in a range of 400° C. to 450° C., because residual organic materials remaining in the precursor material are not completely removed and the film may not be sufficiently densified when the calcination temperature is lower than the lower limit value. On the other hand, when the calcination temperature exceeds the upper limit value, it may be difficult to control the orientation due to promotion of the crystallization. The calcination time in the second stage is preferably from 3 minutes to 10 minutes, because the residual organic materials are not sufficiently removed, and peeling or cracks of the film may be easily generated due to generation of strong stress at the time of crystallization when the calcination time is shorter than the lower limit value. On the other hand, when the calcination time exceeds the upper limit value, the process time is increased and productivity may be decreased.

Sintering can be finally collectively performed after repeating a plurality of steps from the application of the composition to the calcination so as to have a desired film thickness. On the other hand, when the composition and the like of the present embodiment described above are used as the raw material solution, stress derived from film shrinkage generated at the time of forming a film can be prevented. Thus, a thick film having a thickness of approximately several hundreds of nm can be formed by a single coating step, without generating voids or cracks. Accordingly, the number of steps to be repeated described above can be decreased.

The sintering is a step of sintering the coating film after the calcination at a temperature equal to or higher than a crystallization temperature to crystallize the coating film, and thereby a piezoelectric film is obtained. As a sintering atmosphere of this crystallization step, $O_2$, $N_2$, Ar, $N_2O$, or $H_2$, or mixed gas thereof is suitable. The sintering is performed at 600° C. to 700° C. for approximately 1 minute to 5 minutes. The sintering may be performed by using a rapid thermal annealing (RTA). In a case of performing the sintering by using a rapid thermal annealing (RTA), a rate of temperature rise thereof is preferably from 2.5° C./sec to 100° C./sec. By repeating the steps from the application of the composition to the sintering described above several times, a thicker piezoelectric film may be obtained.

Figure 2:
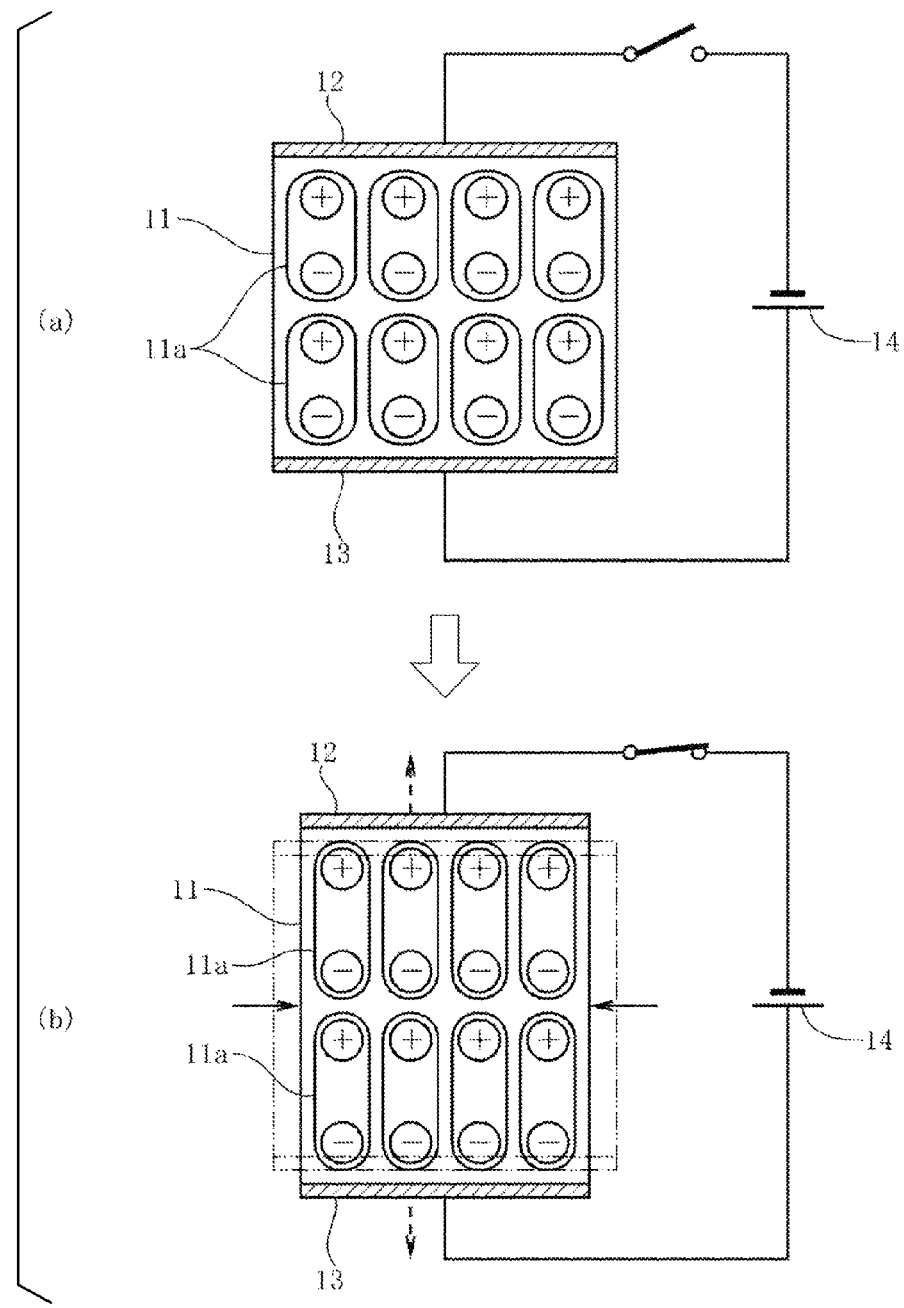
FIG. 2 is a schematic view showing behaviors of a piezoelectric film, when a voltage is applied to a piezoelectric film manufactured by using a composition for forming a Mn and Nb co-doped PZT-based piezoelectric film of the embodiment of the present invention.

By performing the steps described above, the Mn and Nb co-doped PZT-based piezoelectric film can be obtained. According to this piezoelectric film, it is possible to improve a piezoelectric constant by doping with Mn and Nb, and thus, it is possible to obtain greater displacement than that in a predetermined electric field and to decrease a dielectric constant. Accordingly, in a case of using this piezoelectric film as a sensor, the advantages are increased. One main reason thereof is considered to be because added Mn and Nb are substituted with Zr or Ti and cause oxygen deficiency. As shown in FIG. 1, which will be described later, in this piezoelectric film, a hysteresis curve is greatly shifted to a positive side and polarization directions are aligned upwardly (in the film thickness direction) immediately after the film is formed. Even when a poling process is not performed, such a film can be operated as a device by applying an electric field to a negative side. Therefore, this film can be used as a piezoelectric body without performing a poling process after forming the film. In addition, even when a poling process is performed, depolarization due to thermal treatment such as a reflow process hardly occurs and excellent stability of polarization is obtained after the poling process. Thus, it is possible to stably operate the film as a device by applying an electric field to a negative side. Therefore, this film can be used as a piezoelectric body. Specifically, as shown in FIG. 2, a state in which each molecule 11a in a piezoelectric film 11 is polarized is maintained, before applying a DC voltage 14 between electrodes 12 and 13 each of which is disposed on each of surfaces of the piezoelectric film 11 (FIG. 2(a)). As shown in FIG. 2(b), when a voltage is applied between the electrodes 12 and 13 each of which is disposed on each of the surfaces of the piezoelectric film 11, the piezoelectric film 11 expands in a direction where the voltage is applied, and when this voltage is set as zero, the piezoelectric film 11 expanded in a direction where the voltage is applied, shrinks and returns to the original state (FIG. 2(a)). Thus, the piezoelectric film can be used as a piezoelectric element or the like. In this embodiment, a piezoelectric film having a property of expanding in a direction where the voltage is applied is described, but a piezoelectric film having a property of expanding in a direction orthogonal to a direction where the voltage is applied may be used.

In a case where this Mn and Nb co-doped PZT-based piezoelectric film is used as a gyro sensor or the like, it is not necessary to perform a poling process, and thus, the number of manufacturing steps can be decreased. Although this piezoelectric film is a thick film comparatively simply obtained with a small number of steps at the time of forming the film, cracks are extremely slight and a dense film structure is obtained, and thus, electric properties are extremely good. Since the film is formed by performing the sintering at a high temperature of 600° C. to 700° C., piezoelectric properties are not lost, even when a device using the piezoelectric film is exposed to a high temperature for reflow-type soldering. Accordingly, the Mn and Nb co-doped PZT-based piezoelectric film formed by using the composition of the embodiment can be suitably used as a configuration material of a composite electronic component such as a piezoelectric element, an IPD, or a pyroelectric element.

EXAMPLES

Next, examples and comparative examples of the embodiment will be described in detail.

Example 1

First, lead acetate trihydrate (Pb source) and propylene glycol (diol) were put into a reaction vessel and refluxed in a nitrogen atmosphere at a temperature of 150° C. for 1 hour. Then, manganese 2-ethylhexanoate (Mn source), niobium pentaethoxide (Nb source), zirconium tetrabutoxide (Zr source), titanium tetraisopropoxide (Ti source), and acetylacetone (stabilizer) were further added to this reaction vessel and refluxed and reacted with each other in a nitrogen atmosphere at a temperature of 150° C. for 1 hour to prepare a synthetic liquid. Here, each PZT-based precursor of lead acetate trihydrate (Pb source), manganese 2-ethylhexanoate (Mn source), niobium pentaethoxide (Nb source), zirconium tetrabutoxide (Zr source), and titanium tetraisopropoxide (Ti source) was weighed so that a metal atom ratio (Pb:Mn:Nb:Zr:Ti) in the liquid became a value shown in the following Table 1. In addition, propylene glycol (diol) was added so that a content thereof was 16 mass % with respect to 100 mass % of the composition after the preparation, and acetylacetone (stabilizer) was added to have 2 moles with respect to 1 mole of the total amount of Mn, Nb, Zr, and Ti contained in the prepared composition. Then, unnecessary solvent was removed by performing reduced pressure distillation, so that a concentration of the PZT-based precursor occupying 100 mass % of the synthetic liquid was 35 mass % in terms of an oxide concentration. Here, the oxide concentration of the concentration of the PZT-based precursor occupying the synthetic liquid is a concentration (an oxide conversion value) of metal oxides occupying 100 mass % of the synthetic liquid which is calculated by assuming that all of the metal atoms contained in the synthetic liquid are desired oxides.

Then, the synthetic liquid was cooled to 25° C. by performing natural cooling at room temperature. 1-Butanol (solvent) was added to this synthetic liquid to obtain a composition in which a concentration of the PZT-based precursor occupying 100 mass % of the composition was 15 mass % in terms of an oxide concentration. The oxide concentration of the concentration of the PZT-based precursor occupying the composition is a concentration (an oxide conversion value) of metal oxides occupying 100 mass % of the composition which is calculated by assuming that all of the metal atoms contained in the composition are desired oxides. This composition was transferred under pressure and filtered with a syringe by using a commercially available membrane filter having a hole diameter of 0.05 μm, and accordingly, the number of particles having a particle size equal to or greater than 0.5 μm was 1 per 1 milliliter of the solution. 16 mass % of propylene glycol (diol) was contained in 100 mass % of the composition.

The obtained composition was dropped on a Pt film (lower electrode) which was an uppermost layer of a silicon substrate set on a spin coater and in which a $SiO_2$ film, a $TiO_2$ film, and a Pt film were laminated from the bottom to the top in this order, and then spin coating was performed at a rotation rate of 2500 rpm for 30 seconds. Thereby, a coated film (gel film) was formed on the Pt film (lower electrode). A silicon substrate where this coated film (gel film) was formed was heated and held (dried) at a temperature of 75° C. for 1 minute by using a hot plate to remove a low-boiling-point solvent and water. After that, the gel film was thermally decomposed by heating and holding (calcinating) the substrate using a hot plate at 300° C. for 5 minutes. Thereby, a calcinated film (Mn and Nb co-doped PZT amorphous film) having a thickness of 100 nm was obtained. A calcinated film having a thickness of 300 nm was obtained by repeating the same operation as described above three times. A silicon substrate where the calcinated film having a thickness of 300 nm was formed was sintered by holding the silicon substrate in an oxygen atmosphere at 700° C. for 1 minute by using a rapid thermal annealing (RTA). A rate of temperature rise at this time was 10° C./sec. Thereby, a piezoelectric film having a thickness of 240 nm was formed on the Pt film (lower electrode). A series of operations from the application of the composition to the sintering described above was repeated five times to adjust a final film thickness to 1200 nm. As the film thickness of the piezoelectric film, a thickness (total thickness) of a cross-section of the piezoelectric film was measured with SEM (S4300 manufactured by Hitachi, Ltd.). When the composition of the formed piezoelectric film was measured by X-ray fluorescence analysis, the film had the composition shown in the following Table 3. In some examples and comparative examples such as Example 1, a decrease in the amount of Pb was observed in the formed film, but this was due to the evaporation of the Pb source during the film formation such as sintering.

Examples 2 and 3

A composition was prepared and a piezoelectric film was formed in the same manner as in Example 1, except for adjusting the rate of propylene glycol (diol) occupying 100 mass % of the prepared composition to be a rate shown in the following Table 1. The piezoelectric films formed in Examples 2 and 3 had compositions shown in the following Table 3.

Examples 4 to 6

A composition was prepared and a piezoelectric film was formed in the same manner as in Example 1, except for adjusting the rate of propylene glycol (diol) occupying 100 mass % of the composition to be a rate shown in the following Table 1, and adjusting the rate of acetylacetone with respect to 1 mole of the total amount of Mn, Nb, Zr, and Ti to be a rate shown in the following Table 1. The piezoelectric films formed in Examples 4 to 6 had compositions shown in the following Table 3.

Example 7

A composition was prepared and a piezoelectric film was formed in the same manner as in Example 1, except for adjusting the rate of propylene glycol (diol) occupying 100 mass % of the composition to be a rate shown in the following Table 1, and adjusting the concentration of the PZT-based precursor occupying 100 mass % of the composition to be a value shown in the following Table 1, in terms of an oxide concentration. The formed piezoelectric film had a composition shown in the following Table 3.

Example 8

First, lead acetate trihydrate (Pb source) and propylene glycol (diol) were put into a reaction vessel and refluxed in a nitrogen atmosphere at a temperature of 150° C. for 1 hour. Then, manganese 2-ethylhexanoate (Mn source), niobium pentaethoxide (Nb source), zirconium tetrabutoxide (Zr source), titanium tetraisopropoxide (Ti source), and acetylacetone (stabilizer) were further added to this reaction vessel and refluxed and reacted with each other in a nitrogen atmosphere at a temperature of 150° C. for 1 hour to prepare a synthetic liquid. Here, each PZT-based precursor of lead acetate trihydrate (Pb source), manganese 2-ethylhexanoate (Mn source), niobium pentaethoxide (Nb source), zirconium tetrabutoxide (Zr source), and titanium tetraisopropoxide (Ti source) was weighed so that a metal atom ratio (Pb:Mn:Nb:Zr:Ti) in the liquid became a value shown in the following Table 1. In addition, propylene glycol (diol) was added so that a content thereof was 30 mass % with respect to 100 mass % of the composition after the preparation, and acetylacetone (stabilizer) was added to have 2 moles with respect to 1 mole of the total amount of Mn, Nb, Zr, and Ti contained in the prepared composition. Then, unnecessary solvent was removed by performing reduced pressure distillation, so that a concentration of the PZT-based precursor occupying 100 mass % of the synthetic liquid was 35 mass % in terms of an oxide concentration. Here, the oxide concentration of the concentration of the PZT-based precursor occupying the synthetic liquid is a concentration (an oxide conversion value) of metal oxides occupying 100 mass % of the synthetic liquid which is calculated by assuming that all of the metal atoms contained in the synthetic liquid are desired oxides.

Then, the synthetic liquid was cooled to 25° C. by performing natural cooling at room temperature. 1-Octanol (linear monoalcohol having 8 carbon atoms) and ethanol (solvent) were added to this synthetic liquid to obtain a sol-gel solution in which a concentration of the PZT-based precursor occupying 100 mass % of a sol-gel liquid was 25 mass % in terms of an oxide concentration. The oxide concentration of the concentration of the PZT-based precursor occupying the sol-gel solution is a concentration (an oxide conversion value) of metal oxides occupying 100 mass % of the sol-gel solution which is calculated by assuming that all of the metal atoms contained in a sol-gel solution are desired oxides.

Then, polyvinylpyrrolidone (PVP: k value=30) was added to the sol-gel solution so as to have 2 moles of polyvinylpyrrolidone with respect to 1 mole of the PZT-based precursor, in terms of monomers, and stirred at room temperature (25° C.) for 24 hours to obtain a composition. This composition was transferred under pressure and filtered with a syringe by using a commercially available membrane filter having a hole diameter of 0.05 μm, and accordingly, the number of particles having a particle size equal to or greater than 0.5 μm was 1 per 1 milliliter of the solution. The concentration of the PZT-based precursor occupying 100 mass % of the composition was 17 mass % in terms of an oxide concentration (oxide conversion value). The oxide concentration of the concentration of the PZT-based precursor occupying the composition is a concentration (an oxide conversion value) of metal oxides occupying 100 mass % of the composition which is calculated by assuming that all of the metal atoms contained in the composition are desired oxides. In addition, 2 mass % of 1-octanol (linear monoalcohol having 8 carbon atoms) was contained in 100 mass % of the composition. Further, 30 mass % of propylene glycol (diol) was contained in 100 mass % of the composition.

The obtained composition was dropped on a Pt film (lower electrode) which was an uppermost layer of a silicon substrate set on a spin coater and in which a $SiO_2$ film, a $TiO_2$ film, and a Pt film were laminated from the bottom to the top in this order, and then spin coating was performed at a rotation rate of 1800 rpm for 60 seconds. Thereby, a coated film (gel film) was formed on the Pt film (lower electrode). A silicon substrate where this coated film (gel film) was formed was heated and held (dried) at a temperature of 75° C. for 1 minute by using a hot plate to remove a low-boiling-point solvent and water. After that, the gel film was thermally decomposed by heating and holding (calcination in a first stage) the substrate using a hot plate at 300° C. for 5 minutes, and further organic materials and absorbed water remaining in the gel film were removed by heating and holding (calcination in a second stage) using another hot plate at 450° C. for 5 minutes. Thereby, a calcinated film (Mn and Nb co-doped PZT amorphous film) having a thickness of 200 nm was obtained. A calcinated film having a thickness of 400 nm was obtained by repeating the same operation as described above twice. A silicon substrate where the calcinated film having a thickness of 400 nm was formed was sintered by holding the silicon substrate in an oxygen atmosphere at 700° C. for 1 minute by using a rapid thermal annealing (RTA). A rate of temperature rise at this time was 10° C./sec. Thereby, a piezoelectric film having a thickness of 400 nm was formed on the Pt film (lower electrode). A series of operations from the application of the composition to the sintering described above was repeated three times to adjust a final film thickness to 1200 nm. As the film thickness of the piezoelectric film, a thickness (total thickness) of a cross-section of the piezoelectric film was measured with SEM (S4300 manufactured by Hitachi, Ltd.). When the composition of the formed piezoelectric film was measured by X-ray fluorescence analysis, the film had the composition shown in the following Table 3.

Example 9

A composition was prepared and a piezoelectric film was formed in the same manner as in Example 8, except for adjusting the concentration of the PZT-based precursor occupying 100 mass % of the composition to be a value shown in the following Table 1, in terms of an oxide concentration. The formed piezoelectric film had a composition shown in the following Table 3.

Examples 10 and 11

A composition was prepared and a piezoelectric film was formed in the same manner as in Example 1, except for adjusting the rate of propylene glycol (diol) occupying 100 mass % of the composition to be a rate shown in the following Table 1. The piezoelectric films formed in Examples 10 and 11 had compositions shown in the following Table 3.

Examples 12 and 13

A composition was prepared and a piezoelectric film was formed in the same manner as in Example 1, except for adjusting the rate of propylene glycol (diol) occupying 100 mass % of the composition to be a rate shown in the following Table 1, and adjusting the rate of acetylacetone with respect to 1 mole of the total amount of Mn, Nb, Zr, and Ti contained in the prepared composition to be a rate shown in the following Table 1. The piezoelectric films formed in Examples 12 and 13 had compositions shown in the following Table 3.

Comparative Example 1

A composition was prepared and a piezoelectric film was formed in the same manner as in Example 8, except for not using the PZT-based precursors as the Mn source and the Nb source, and weighing each PZT-based precursor of lead acetate trihydrate (Pb source), zirconium tetrabutoxide (Zr source), and titanium tetraisopropoxide (Ti source) so that a metal atom ratio (Pb:Mn:Nb:Zr:Ti) in the liquid became a value shown in the following Table 1, and adding polyvinylpyrrolidone (PVP: k value=30) so as to obtain a rate shown in the following Table 1 with respect to 1 mole of the PZT-based precursor, in terms of monomers. The formed piezoelectric film had a composition shown in the following Table 3.

Here, in Table 1 and Table 2, which will be described later, numerical values in a column of "diol [mass %]" are the amounts (mass %) of diol with respect to 100 mass % of the composition. Numerical values in a column of "acetylacetone [mole]" are the amounts (mole) of acetylacetone with respect to 1 mole of the total amount of Mn, Nb, Zr, and Ti contained in the prepared composition. Numerical values in a column of "PVP [mole]" are the amounts (mole) of polyvinylpyrrolidone with respect to 1 mole of the PZT-based precursor, in terms of monomers. Numerical values in a column of "precursor concentration (oxide concentration) [mass %]" are concentration (mass %) of metal oxides occupying 100 mass % of the composition, in terms of an oxide concentration.

TABLE 1

| | Metal atom ratio in composition (Pb:Mn:Nb:Zr:Ti) | Diol [mass %] | Acetylacetone [mole] | PVP [mole] | Precursor concentration (oxide concentration) [mass %] |
|---|---|---|---|---|---|
| Example 1 | 1.18:0.016:0.016:0.52:0.48 | 16 | 2 | 0 | 15 |
| Example 2 | 1.18:0.016:0.016:0.52:0.48 | 30 | 2 | 0 | 15 |
| Example 3 | 1.18:0.016:0.016:0.52:0.48 | 56 | 2 | 0 | 15 |
| Example 4 | 1.18:0.016:0.016:0.52:0.48 | 30 | 0.5 | 0 | 15 |
| Example 5 | 1.18:0.016:0.016:0.52:0.48 | 30 | 2 | 0 | 15 |
| Example 6 | 1.18:0.016:0.016:0.52:0.48 | 30 | 4 | 0 | 15 |
| Example 7 | 1.18:0.016:0.016:0.52:0.48 | 30 | 2 | 0 | 10 |
| Example 8 | 1.18:0.016:0.016:0.52:0.48 | 30 | 2 | 2 | 17 |
| Example 9 | 1.18:0.016:0.016:0.52:0.48 | 30 | 2 | 2 | 28 |
| Example 10 | 1.18:0.016:0.016:0.52:0.48 | 14 | 2 | 0 | 15 |
| Example 11 | 1.18:0.016:0.016:0.52:0.48 | 60 | 2 | 0 | 15 |
| Example 12 | 1.18:0.016:0.016:0.52:0.48 | 30 | 0.4 | 0 | 15 |
| Example 13 | 1.18:0.016:0.016:0.52:0.48 | 30 | 4.5 | 0 | 15 |
| Comparative Example 1 | 1.15:0:0:0.52:0.48 | 30 | 2 | 0.02 | 25 |

Examples 14 to 21 and Comparative Examples 2 to 9

A composition was prepared and a piezoelectric film was formed in the same manner as in Example 8, except for weighing each PZT-based precursor of lead acetate trihydrate (Pb source), manganese 2-ethylhexanoate (Mn source), niobium pentaethoxide (Nb source), zirconium tetrabutoxide (Zr source), and titanium tetraisopropoxide (Ti source) so that a metal atom ratio (Pb:Mn:Nb:Zr:Ti) in the liquid became a value shown in the following Table 2, and adding polyvinylpyrrolidone (PVP: k value=30) so as to obtain a rate shown in the following Table 2 with respect to 1 mole of the PZT-based precursor, in terms of monomers. The piezoelectric films formed in Examples 14 to 21 and Comparative Examples 2 to 9 had compositions shown in the following Table 4.

TABLE 2

|  | Metal atom ratio in composition (Pb:Mn:Nb:Zr:Ti) | Diol [mass %] | Acetylacetone [mole] | PVP [mole] | Precursor concentration (oxide concentration) [mass %] |
|---|---|---|---|---|---|
| Example 14 | 1.25:0.035:0.035:0.52:0.48 | 30 | 2 | 0.02 | 17 |
| Example 15 | 1.00:0.005:0.005:0.52:0.48 | 30 | 2 | 0.02 | 17 |
| Example 16 | 1.22:0.056:0.014:0.52:0.48 | 30 | 2 | 0.02 | 17 |
| Example 17 | 1.16:0.002:0.008:0.52:0.48 | 30 | 2 | 0.02 | 17 |
| Example 18 | 1.25:0.014:0.056:0.52:0.48 | 30 | 2 | 0.02 | 17 |
| Example 19 | 1.16:0.008:0.002:0.52:0.48 | 30 | 2 | 0.02 | 17 |
| Example 20 | 1.17:0.01:0.01:0.60:0.40 | 30 | 2 | 0.02 | 17 |
| Example 21 | 1.17:0.01:0.01:0.40:0.60 | 30 | 2 | 0.02 | 17 |
| Comparative Example 2 | 1.27:0.035:0.035:0.52:0.48 | 30 | 2 | 0.02 | 17 |
| Comparative Example 3 | 0.98:0.01:0.01:0.52:0.48 | 30 | 2 | 0.02 | 17 |
| Comparative Example 4 | 1.25:0.06:0.01:0.52:0.48 | 30 | 2 | 0.02 | 17 |
| Comparative Example 5 | 1.16:0.001:0.009:0.52:0.48 | 30 | 2 | 0.02 | 17 |
| Comparative Example 6 | 1.25:0.01:0.06:0.52:0.48 | 30 | 2 | 0.02 | 17 |
| Comparative Example 7 | 1.16:0.009:0.001:0.52:0.48 | 30 | 2 | 0.02 | 17 |
| Comparative Example 8 | 1.17:0.01:0.01:0.62:0.38 | 30 | 2 | 0.02 | 17 |
| Comparative Example 9 | 1.17:0.01:0.01:0.38:0.62 | 30 | 2 | 0.02 | 17 |

<Comparative Test and Evaluation>

Regarding the piezoelectric films formed in Examples 1 to 21 and Comparative Examples 1 to 9, a film composition, the deviation of hysteresis, a relative permittivity, a piezoelectric constant $e_{31,f}$, presence or absence of cracks, and an orientation degree of crystals to (100) plane were respectively evaluated. In addition, the storage stability of the compositions adjusted in Examples 1 to 21 and Comparative Examples 1 to 9 was evaluated. The results thereof are shown in the following Table 3 and Table 4.

(i) Film composition: the composition of the piezoelectric film was analyzed by X-ray fluorescence analysis using a X-ray fluorescence spectrometer (type name: Primus III+ manufactured by Rigaku Corporation).

(ii) Deviation (shift amount) of hysteresis: first, a pair of electrodes having a diameter of 200 μm were respectively formed on the upper surface of the piezoelectric film by using a sputtering method, the rapid thermal annealing (RTA) was performed, the piezoelectric film was maintained in an oxygen atmosphere at 700° C. for 1 minute, and annealed to repair damages, and a MIM (Metal-Insulator-Metal) capacitor structure was prepared. A piezoelectric element (capacitor element) having this capacitor structure was set as a test sample. The deviation of the hysteresis was evaluated by measuring the polarization hysteresis of the obtained capacitor element using a ferroelectric evaluation device (TF-analyzer 2000 manufactured by aixACCT Systems).

Specifically, the hysteresis of the polarization quantity of the piezoelectric film was measured by applying a voltage of 25 V at a frequency of 1 kHz, and a hysteresis curve setting an X axis as an electric field (kV/cm) and a Y axis as a polarization quantity (μC/cm$^2$) as shown in FIG. 1 was obtained. In the obtained hysteresis curve, absolute values of positive and negative coercive electric fields in a case where the polarization quantity was 0 were respectively set as Ec$^+$ (kV/cm) and Ec$^-$ (kV/cm), and a value of Ec$^+$−(Ec$^+$+Ec$^-$)/2 was obtained and determined as the deviation of hysteresis. For comparison, hysteresis curves of Example 16 and Comparative Example 1 measured by using this method are shown in FIG. 1.

(iii) Relative permittivity: after measuring a dielectric constant of the piezoelectric element used for measuring the deviation of the hysteresis of the piezoelectric film using a ferroelectric evaluation device (TF-analyzer 2000 manufactured by aixACCT Systems), relative permittivity was calculated by dividing the measured dielectric constant by a dielectric constant of vacuum, for realizing dimensionless.

(iv) Piezoelectric constant $e_{31,f}$: the piezoelectric film was processed into a strip form using focused ion beams (FIB), and the piezoelectric film processed into a strip form was held in an electric field of 100 kV/cm at a temperature of 110° C. for 1 minute to perform a poling process. The charge amount generated by applying strain to the piezoelectric film subjected to the poling process was measured using a piezoelectric evaluation device (aixPES manufactured by aixACCT Systems) to obtain a piezoelectric constant $e_{31,f}$.

(v) Presence or absence of cracks: presence or absence of cracks was determined from an SEM image obtained by imaging microstructures of a film surface and a film cross-section, using a scanning electron microscope (SEM) used in the film thickness measurement described above. Here, a crack is a crack having a minor axis equal to or greater than 30 nm and a major axis equal to or greater than 200 nm in an SEM image having a size of 26 μm×19 μm (magnification: ×5000). The measurement was performed in three regions which were randomly selected from the piezoelectric film obtained in each of Examples and Comparative Examples. It was determined as "absence" when cracks were not observed, and it was determined as "presence" when cracks were observed.

(vi) Orientation degree: an orientation degree was obtained by calculating intensity of (100) plane/{intensity of (100) plane+intensity of (110) plane+intensity of (111) plane} from a diffraction result obtained by a concentration method using an X-ray diffraction (XRD) device (type name: Empyrean manufactured by PANalytical B.V.).

(vii) Storage stability of composition: the obtained composition was stored under the conditions of a temperature of 40° C. and relative humidity of 50% RH for a month and presence or absence of precipitate in the stored composition was visually observed. In Tables 3 and 4, "absence" indicates a case where no generation of precipitate was visually observed at all when the stored composition was observed, and "presence of slight amount" indicates a case where a slight amount of precipitate which was approximately 1% in terms of a volume ratio was visually observed.

TABLE 3

|  | Metal atom ratio in film (Pb:Mn:Nb:Zr:Ti) | Evaluation of film ||||| Evaluation of composition |
|---|---|---|---|---|---|---|---|
|  |  | Deviation of hysteresis [kV/cm] | Relative permittivity | Piezoelectric constant $e_{31,f}$ | Presence or absence of cracks | Orientation degree [%] | Storage stability (presence or absence of precipitate) |
| Example 1 | 1.05:0.016:0.016:0.52:0.48 | 10 | 1150 | −13.2 | Absence | 92 | Absence |
| Example 2 | 1.05:0.016:0.016:0.52:0.48 | 11 | 1200 | −12.1 | Absence | 90 | Absence |
| Example 3 | 1.04:0.016:0.016:0.52:0.48 | 10 | 1210 | −12.7 | Absence | 98 | Absence |
| Example 4 | 1.05:0.016:0.016:0.52:0.48 | 12 | 1110 | −13.6 | Absence | 92 | Absence |
| Example 5 | 1.06:0.016:0.016:0.52:0.48 | 9 | 1130 | −12.3 | Absence | 90 | Absence |
| Example 6 | 1.04:0.016:0.016:0.52:0.48 | 9 | 1200 | −11.4 | Absence | 91 | Absence |
| Example 7 | 1.05:0.016:0.016:0.52:0.48 | 10 | 1170 | −11.9 | Absence | 89 | Absence |
| Example 8 | 1.04:0.016:0.016:0.52:0.48 | 12 | 1090 | −14.3 | Absence | 90 | Absence |
| Example 9 | 1.05:0.016:0.016:0.52:0.48 | 11 | 1130 | −12.4 | Absence | 90 | Absence |
| Example 10 | 1.04:0.016:0.016:0.52:0.48 | 11 | 1100 | −8.3 | Absence | 92 | Presence of slight amount |
| Example 11 | 1.05:0.016:0.016:0.52:0.48 | 11 | 1200 | −4.2 | Absence | 98 | Absence |
| Example 12 | 1.05:0.016:0.016:0.52:0.48 | 10 | 1120 | −11 | Absence | 92 | Presence of slight amount |
| Example 13 | 1.04:0.016:0.016:0.52:0.48 | 9 | 1470 | −11.3 | Absence | 95 | Absence |
| Comparative Example 1 | 1.04:0:0:0.52:0.48 | 0 | 1550 | −14.9 | Absence | 93 | Absence |

As shown in Table 3, the shift of the hysteresis was not observed in Comparative Example 1 where Mn and Nb were not doped, when Examples 1 to 9 and Comparative Example 1 were compared to each other. On the other hand, in Examples 1 to 9 in which Mn and Nb were doped at a desired rate, the dielectric constant could be decreased in a state where the piezoelectric constant was maintained as a comparatively high value, and a piezoelectric film useful as a sensor was obtained. The shift of the hysteresis was observed and it was found that depolarization hardly occurred after the poling process. In addition, the generation of precipitate was not observed, even when the composition was stored for a long period of time, and thus it was found that excellent storage stability was obtained.

When Examples 1 to 9 and Examples 10 to 13 were compared to each other, a slight amount of precipitate was observed in the stored composition in Examples 10 and 12 in which the amount of diol or acetylacetone added was small. On the other hand, in Examples 11 and 13 in which the amount of diol or acetylacetone added was great, although an excellent result was obtained regarding the storage stability, a slight effect on a relative permittivity or a piezoelectric constant was observed. Therefore, it was found that it was desirable to control the amount of diol or acetylacetone added at a predetermined rate.

TABLE 4

|  | Metal atom ratio in film (Pb:Mn:Nb:Zr:Ti) | Evaluation of film ||||| Evaluation of composition |
|---|---|---|---|---|---|---|---|
|  |  | Deviation of hysteresis [kV/cm] | Relative permittivity | Piezoelectric constant $e_{31,f}$ | Presence or absence of cracks | Orientation degree [%] | Storage stability (presence or absence of precipitate) |
| Example 14 | 1.07:0.035:0.035:0.52:0.48 | 17 | 920 | −11.2 | Absence | 90 | Absence |
| Example 15 | 0.98:0.005:0.005:0.52:0.48 | 16 | 820 | −11.8 | Absence | 92 | Absence |
| Example 16 | 1.08:0.056:0.014:0.52:0.48 | 25 | 840 | −11.9 | Absence | 92 | Absence |
| Example 17 | 1.02:0.002:0.008:0.52:0.48 | 4 | 1320 | −14.3 | Absence | 99 | Absence |
| Example 18 | 1.12:0.014:0.056:0.52:0.48 | 10 | 1200 | −13.2 | Absence | 98 | Absence |
| Example 19 | 1.01:0.008:0.002:0.52:0.48 | 6 | 1000 | −12.4 | Absence | 95 | Absence |
| Example 20 | 1.03:0.01:0.01:0.60:0.40 | 7 | 940 | −12.1 | Absence | 99 | Absence |
| Example 21 | 1.10:0.01:0.01:0.40:0.60 | 7 | 930 | −8.3 | Absence | 92 | Absence |
| Comparative Example 2 | 1.15:0.035:0.035:0.52:0.48 | 16 | 870 | −6.2 | Absence | 90 | Absence |
| Comparative Example 3 | 0.95:0.01:0.01:0.52:0.48 | 6 | 650 | −4.7 | Absence | 90 | Absence |
| Comparative Example 4 | 1.09:0.06:0.01:0.52:0.48 | 25 | 900 | −5.2 | Absence | 94 | Absence |
| Comparative Example 5 | 1.02:0.001:0.009:0.52:0.48 | 1 | 1490 | −13.2 | Absence | 92 | Absence |
| Comparative Example 6 | 1.12:0.01:0.06:0.52:0.48 | 3 | 1520 | −12.0 | Absence | 90 | Absence |
| Comparative Example 7 | 1.03:0.009:0.001:0.52:0.48 | 3 | 1480 | −11.8 | Absence | 94 | Absence |
| Comparative Example 8 | 1.03:0.01:0.01:0.62:0.38 | 6 | 1130 | −8.5 | Absence | 92 | Absence |
| Comparative Example 9 | 1.03:0.01:0.01:0.38:0.68 | 8 | 940 | −6.0 | Absence | 94 | Absence |

As shown in Table 4, the piezoelectric constant was decreased in Comparative Example 3 in which the rate of Pb was small and Comparative Example 2 in which the rate of Pb was great, when Examples 14 to 21 and Comparative Examples 2 to 9 were compared to each other. In Comparative Example 5 in which the rate of Mn was small, the shift of the hysteresis was substantially not observed and the relative permittivity was not sufficiently decreased. On the other hand, in Comparative Example 4 in which the rate of Mn was great, the piezoelectric constant was decreased. In Comparative Example 7 in which the rate of Nb was small and Comparative Example 6 in which the rate of Nb was great, the relative permittivity was not sufficiently decreased, either. In Comparative Example 8 in which the rate of Ti with respect to the rate of Zr was small and Comparative Example 9 in which the rate of Ti with respect to the rate of Zr was great, the piezoelectric constant was decreased. With respect to this, in Examples 14 to 21 in each of which the composition was controlled to have a desired film composition by using a composition containing metal elements in a desired range, piezoelectric films having excellent properties were obtained, without any defects generated in Comparative Examples 2 to 9 described above.

Hereinabove, the preferred examples of the invention have been described, but the invention is not limited to these examples. Addition, omission, replacement, and other modifications of the configuration can be performed within a range not departing from a scope of the invention. The invention is not limited to the descriptions described above and only limited to the range of accompanied claims.

INDUSTRIAL APPLICABILITY

The composition for forming the Mn and Nb co-doped PZT-based piezoelectric film of the invention can be used for manufacturing of a configuration material of a composite electronic component such as a piezoelectric element, an IPD, or a pyroelectric element.

The invention claimed is:

1. A composition for forming a Mn and Nb co-doped PZT-based piezoelectric film used for forming a PZT-based piezoelectric film formed of Mn and Nb co-doped composite metal oxides, the composition comprising:
    PZT-based precursors containing metal atoms configuring the composite metal oxides;
    acetylacetone as a stabilizer; and
    a diol as a solvent,
    wherein the PZT-based precursors are contained in the composition so that a metal atom ratio (Pb:Mn:Nb:Zr:Ti) in the composition satisfies (1.00 to 1.25):(0.002 to 0.056):(0.002 to 0.056):(0.40 to 0.60):(0.40 to 0.60),
    a rate of Mn is from 0.20 to 0.80 when the total of metal atom rates of Mn and Nb is 1,
    a rate of Zr is from 0.40 to 0.60 when the total of metal atom rates of Zr and Ti is 1, and
    the total rate of Zr and Ti is from 0.9300 to 0.9902 when the total of metal atom rates of Mn, Nb, Zr, and Ti is 1,
    the diol is propylene glycol or ethylene glycol,
    an amount of acetylacetone contained in the composition is from 0.5 moles to 4 moles when the total amount of Mn, Nb, Zr, and Ti contained in the composition is 1 mole, and
    a rate of the diol in 100 mass % of the composition is from 16 mass % to 56 mass %.

2. The composition for forming a Mn and Nb co-doped PZT-based piezoelectric film according to claim 1, further comprising:
    polyvinylpyrrolidone at a rate so as to obtain 0.01 moles to 0.25 moles of polyvinylpyrrolidone with respect to 1 mole of the PZT-based precursor, in terms of monomers.

* * * * *